(12) United States Patent
Imamura et al.

(10) Patent No.: US 11,972,934 B2
(45) Date of Patent: Apr. 30, 2024

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Tomoki Imamura, Toyama (JP); Takaaki Noda, Toyama (JP); Kazuyuki Okuda, Toyama (JP); Masato Terasaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 493 days.

(21) Appl. No.: 17/361,845

(22) Filed: Jun. 29, 2021

(65) Prior Publication Data
US 2021/0407774 A1 Dec. 30, 2021

(30) Foreign Application Priority Data
Jun. 30, 2020 (JP) .................. 2020-112463

(51) Int. Cl.
*C23C 16/44* (2006.01)
*C23C 16/34* (2006.01)
(Continued)

(52) U.S. Cl.
CPC ........ *H01J 37/32871* (2013.01); *C23C 16/34* (2013.01); *C23C 16/4405* (2013.01);
(Continued)

(58) Field of Classification Search
CPC .. C23C 16/4405; C23C 16/4404; C23C 16/52
See application file for complete search history.

(56) References Cited

U.S. PATENT DOCUMENTS

| 2006/0141782 A1 | 6/2006 | Hasebe et al. |
| 2008/0264339 A1 | 10/2008 | Hasebe et al. |

(Continued)

FOREIGN PATENT DOCUMENTS

| JP | 2003-188159 A | 7/2003 |
| JP | 2006-190977 A | 7/2006 |

(Continued)

OTHER PUBLICATIONS

Japanese Office Action dated May 10, 2022 for Japanese Patent Application No. 2020-112463.

(Continued)

*Primary Examiner* — Jae Lee
(74) *Attorney, Agent, or Firm* — Volpe Koenig

(57) ABSTRACT

There is provided a technique that includes: performing a set a plurality of times, the set including: (a) loading at least one substrate into a process container; (b) performing a process of forming a nitride film on the at least one substrate by supplying a film-forming gas to the at least one substrate supported by a support in the process container; (c) unloading the processed at least one substrate from an interior of the process container; and (d) supplying an oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

21 Claims, 6 Drawing Sheets

(51) Int. Cl.
*C23C 16/50* (2006.01)
*H01J 37/32* (2006.01)
*H01L 21/31* (2006.01)

(52) U.S. Cl.
CPC ........ *C23C 16/50* (2013.01); *H01J 37/32788* (2013.01); *H01J 37/32834* (2013.01); *H01L 21/31* (2013.01); *H01J 2237/332* (2013.01)

(56) References Cited

U.S. PATENT DOCUMENTS

| | | | |
|---|---|---|---|
| 2010/0216306 A1 | 8/2010 | Yoshimi et al. | |
| 2011/0059600 A1* | 3/2011 | Sakai | H01L 21/67028 438/584 |
| 2014/0272184 A1* | 9/2014 | Sreekala | C23C 16/4405 427/534 |
| 2014/0345644 A1* | 11/2014 | Okabe | C23C 16/4405 134/1.1 |
| 2015/0031204 A1* | 1/2015 | Sasaki | H01L 21/28556 438/685 |
| 2023/0201889 A1* | 6/2023 | Yamakado | C23C 16/4404 438/778 |

FOREIGN PATENT DOCUMENTS

| | | |
|---|---|---|
| JP | 2008-140864 A | 6/2008 |
| JP | 2010-219308 A | 9/2010 |
| JP | 2015-025146 A | 2/2015 |

OTHER PUBLICATIONS

Singapore Search Report dated Jun. 30, 2022 for Singapore Patent Application No. 10202107197Q.

Singapore Written Opinion dated Jun. 30, 2022 for Singapore Patent Application No. 10202107197Q.

* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-112463, filed on Jun. 30, 2020, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

In the related art, as a process of manufacturing a semiconductor device, a film-forming process of forming a film such as a nitride film on a substrate in a process container may be performed. When performing the film-forming process, a film is also formed in the process container. By repeating the film-forming process, the film is cumulatively deposited in the process container. The cumulative film formed in the process container is cracked or peeled off as the thickness thereof exceeds a critical film thickness. Thus, particles are generated, which may be a cause of foreign substance contamination. For this reason, the interior of the process container may be periodically cleaned to remove the cumulative film. However, during the cleaning, the film-forming process cannot be performed. In a case where a cleaning frequency is high, that is, in a case where a cleaning cycle is short, productivity of the film-forming process may deteriorate.

SUMMARY

Some embodiments of the present disclosure provide a technique capable of properly suppressing generation of particles due to a film formed in a process container to prolong a cleaning cycle and improve productivity of a film-forming process.

According to embodiments of the present disclosure, there is provided a technique that includes: performing a set a plurality of times, the set including: (a) loading at least one substrate into a process container; (b) performing a process of forming a nitride film on the at least one substrate by supplying a film-forming gas to the at least one substrate supported by a support in the process container; (c) unloading the processed at least one substrate from an interior of the process container; and (d) supplying an oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure embodiments of the various embodiments.

Embodiments of the Present Disclosure

Hereinafter, embodiments of the present disclosure will be described mainly with reference to FIGS. 1 to 4.

(1) Configuration of Substrate Processing Apparatus

Figure 1:
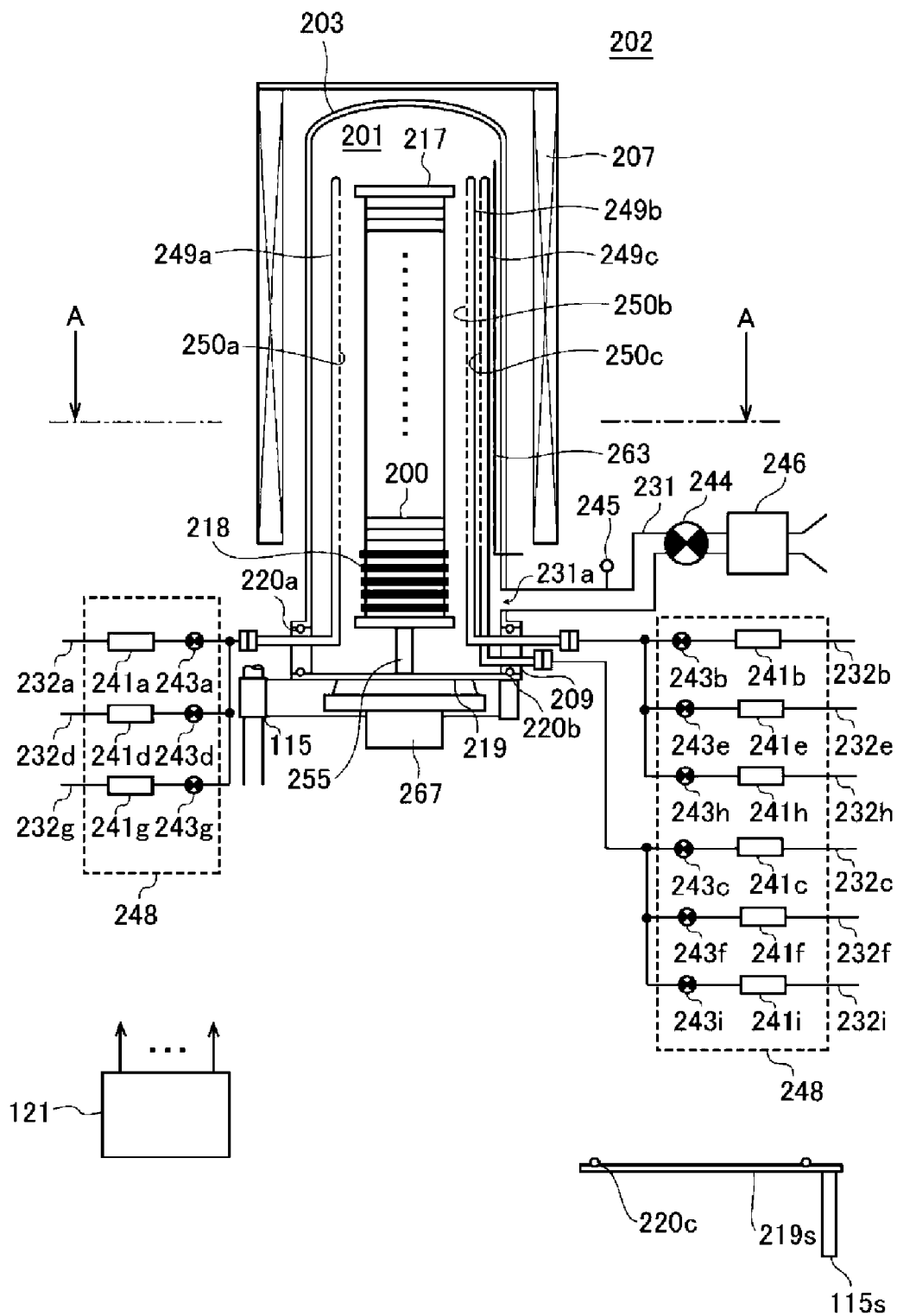
FIG. 1 is a schematic configuration diagram of a vertical process furnace of a substrate processing apparatus suitably used in embodiments of the present disclosure, in which a portion of a process furnace 202 is depicted in a vertical cross-sectional view.

As shown in FIG. 1, a process furnace 202 includes a heater 207 as a temperature regulator (heating part). The heater 207 has a cylindrical shape and is supported by a holding plate to be vertically installed. The heater 207 also functions as an activation mechanism (excitation part) configured to activate (excite) a gas with heat.

A reaction tube 203 is disposed inside the heater 207 to be concentric with the heater 207. The reaction tube 203 is made of, for example, a heat-resistant material such as quartz ($SiO_2$) or silicon carbide (SiC), and is formed in a cylindrical shape with its upper end closed and its lower end opened. A manifold 209 is disposed below the reaction tube 203 in a concentric relationship with the reaction tube 203. The manifold 209 is made of, for example, a metal material such as stainless steel (SUS), and is formed in a cylindrical shape with its upper and lower ends opened. The upper end of the manifold 209 engages with the lower end of the reaction tube 203, and is configured to support the reaction tube 203. An O-ring 220a as a seal is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow portion of the process container. The process chamber 201 is configured to be capable of accommodating wafers 200 as substrates. The wafers 200 are processed in the process chamber 201. The wafers 200 include product wafers as product substrates and dummy wafers as dummy substrates. The dummy wafers include side dummy wafers arranged at ends of regions where the product wafers are arranged, and fill dummy wafers arranged at portions where the product wafers are not charged.

Nozzles 249a to 249c as first to third supply parts are respectively installed in the process chamber 201 to penetrate a side wall of the manifold 209. The nozzles 249a to 249c are also referred to as first to third nozzles, respectively. The nozzles 249a to 249c are each made of, for example, a heat-resistant material such as quartz or SiC. Gas supply pipes 232a to 232c are connected to the nozzles 249a to 249c, respectively.

Mass flow controllers (MFCs) 241a to 241c as flow rate controllers (flow rate controllers) and valves 243a to 243c as opening/closing valves are installed at the gas supply pipes 232a to 232c sequentially from corresponding upstream sides of gas flow respectively. Gas supply pipes 232d and 232g are respectively connected to the gas supply pipe 232a at the downstream side of the valve 243a. Gas supply pipes 232e and 232h are respectively connected to the gas supply pipe 232b at the downstream side of the valve 243b. Gas supply pipes 232f and 232i are respectively connected to the gas supply pipe 232c at the downstream side of the valve 243c. MFCs 241d to 241i and valves 243d to 243i are installed at the gas supply pipes 232d to 232i sequentially from corresponding upstream sides of gas flow respectively. The gas supply pipes 232a to 232i are made of, for example, a metal material such as SUS.

Figure 2:
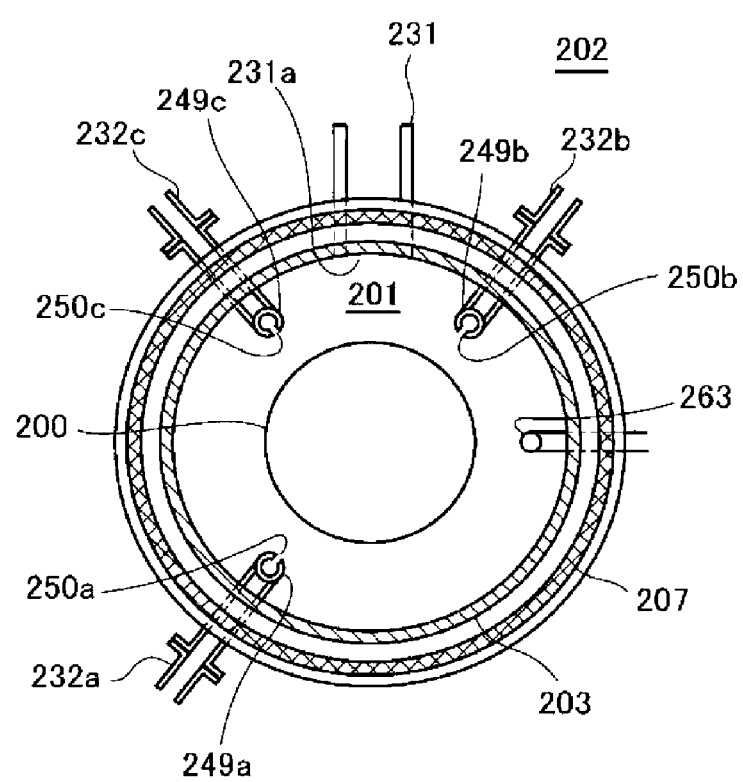
FIG. 2 is a schematic configuration diagram of a vertical process furnace of the substrate processing apparatus suitably used in embodiments of the present disclosure, in which a portion of the process furnace 202 is depicted in a cross-sectional view taken along a line A-A in FIG. 1.

As shown in FIG. 2, the nozzles 249a to 249c are installed in a space having an annular shape in a plane view between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are respectively installed at a lateral side of a wafer arrangement region in which the wafers 200 are arranged, that is, in a region which horizontally surrounds the wafer arrangement region, to extend along the wafer arrangement region.

The nozzle 249a is disposed at a position that is farther from an exhaust port 231a to be described below than positions where the nozzles 249b and 249c are arranged. That is, the nozzles 249b and 249c are disposed at positions that are closer to the exhaust port 231a than the position where the nozzles 249a is arranged. Further, in a plane view, the nozzles 249b and 249c are disposed in a line symmetric relationship with respect to a straight line as a symmetry axis passing through a center of the wafer 200 loaded into the process chamber 201, that is, a straight line as a symmetry axis passing through a center of the reaction tube 203 and a center of the exhaust port 231a. Further, the nozzles 249a and 249b are disposed on a straight line to face each other across the center of the reaction tube 203.

Gas supply holes 250a to 250c configured to supply gases are installed at side surfaces of the nozzles 249a to 249c, respectively. The gas supply holes 250a to 250c are respectively opened to face the center of the reaction tube 203, and are configured to be capable of supplying gases toward the wafers 200. The gas supply holes 250a and 250b are opened to face each other on a straight line across the center of the wafer 200, that is, the center of the reaction tube 203. The gas supply holes 250a to 250c are installed over a range from the lower portion to the upper portion of the reaction tube 203.

From the gas supply pipe 232a, a precursor (precursor gas), for example, a silane-based gas containing silicon (Si) as a main element constituting a film to be formed on the wafer 200, is supplied into the process chamber 201 via the MFC241a, the valve 243a, and the nozzle 249a. As the silane-based gas, for example, a gas containing Si and halogen, that is, a halosilane-based gas may be used. Halogen may include chlorine (Cl), fluorine (F), bromine (Br), iodine (I), and the like. As the halosilane-based gas, for example, a chlorosilane-based gas containing Si and Cl may be used.

From the gas supply pipes 232b and 232c, a nitriding gas (nitriding agent), for example, a nitrogen (N)- and hydrogen (H)-containing gas, that is, a hydrogen nitride-based gas is supplied into the process chamber 201 via the MFCs 241b and 241c, the valves 243b and 243c, the nozzles 249b and 249c. The N- and H-containing gas is a N-containing gas and a H-containing gas.

From the gas supply pipe 232d, a cleaning gas, for example, a fluorine (F)-containing gas is supplied into the process chamber 201 via the MFC 241d, the valve 243d, the gas supply pipe 232a, and the nozzle 249a.

From the gas supply pipe 232f, an oxidizing gas (oxidizing agent), for example, an oxygen (O)-containing gas is supplied into the process chamber 201 via the MFC 241f, the valve 243f, the gas supply pipe 232c, and the nozzle 249c.

From the gas supply pipe 232e, a reducing gas (reducing agent), for example, a hydrogen (H)-containing gas is supplied into the process chamber 201 via the MFC 241e, the valve 243e, the gas supply pipe 232b, and the nozzle 249b. Although the H-containing gas by itself does not have an oxidizing action, it reacts with an O-containing gas under a specific condition to generate an oxidizing species such as atomic oxygen (O), thereby acting to improve an efficiency of an oxidizing process.

From the gas supply pipes 232g to 232i, an inert gas is supplied into the process chamber 201 via the MFCs 241g to 241i, the valves 243g to 243i, the gas supply pipes 232a to 232c, and the nozzles 249a to 249c, respectively. The inert gas acts as a purge gas, a carrier gas, a diluting gas, and the like.

A precursor gas supply system mainly includes the gas supply pipe 232a, the MFC 241a, and the valve 243a. A nitriding gas supply system (N- and H-containing gas supply system) mainly includes the gas supply pipes 232b and 232c, the MFCs 241b and 241c, and the valves 243b and 243c. An oxidizing gas supply system (O-containing gas supply system) mainly includes the gas supply pipe 232f, the MFC241f, and the valve 243f A reducing gas supply system (H-containing gas supply system) mainly includes the gas supply pipe 232e, the MFC 241e, and the valve 243e. A cleaning gas supply system (F-containing gas supply system) mainly includes the gas supply pipe 232d, the MFC 241d, and the valve 243d. An inert gas supply system mainly includes the gas supply pipes 232g to 232i, the MFCs 241g to 241i, and valves 243g to 243i.

Each or both of the precursor gas and the N- and H-containing gas is also referred to as a film-forming gas, and each or both of the precursor gas supply system and the N- and H-containing gas supply system is also referred to as a film-forming gas supply system. Further, each or both of the O-containing gas and the H-containing gas may be referred to as an oxidizing gas, and each or both of the O-containing gas supply system and the H-containing gas supply system may be referred to as an oxidizing gas supply system.

One or all of various gas supply systems described above may be configured as an integrated gas supply system 248 in which the valves 243a to 243i, the MFCs 241a to 241i, and the like are integrated. The integrated gas supply system 248 is connected to each of the gas supply pipes 232a to 232i, and is configured such that operations of supplying various gases into the gas supply pipes 232a to 232i, that is, an operation of opening and closing the valves 243a to 243i, an operation of regulating flow rates by the MFCs 241a to 241i, and the like are controlled by a controller 121 to be described below. The integrated gas supply system 248 is configured as an integral type or division type integrated unit, and may be attached to or detached from the gas supply pipes 232a to 232i or the like on an integrated unit basis, such that maintenance, replacement, expansion, and the like of the integrated gas supply system 248 may be performed on the integrated unit basis.

The exhaust port 231a configured to exhaust an internal atmosphere of the process chamber 201 is installed at a lower side of the sidewall of the reaction tube 203. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an APC (Auto Pressure Controller) valve 244 as a pressure regulator (pressure regulation part). The APC valve 244 is configured so that a vacuum exhaust and a vacuum exhaust stop of the interior of the process chamber 201 may be performed by opening and closing the APC valve 244 while operating the vacuum pump 246 and so that the internal pressure of the process chamber 201 may be regulated by adjusting an opening degree of the valve based on pressure information detected by the pressure sensor 245 while operating the vacuum pump 246. An exhaust system mainly includes the exhaust pipe 231, the APC valve 244, and the pressure sensor 245. The vacuum pump 246 may be included in the exhaust system.

A seal cap 219, which serves as a furnace opening lid configured to be capable of hermetically sealing a lower end opening of the manifold 209, is installed under the manifold 209. The seal cap 219 is made of a metal material such as SUS, and is formed in a disc shape. An O-ring 220b, which is a seal making contact with the lower end portion of the manifold 209, is installed on an upper surface of the seal cap 219. A rotation mechanism 267 configured to rotate a boat 217 to be described below is installed under the seal cap 219. A rotation shaft 255 of the rotation mechanism 267 that penetrates the seal cap 219 is connected to the boat 217. The rotation mechanism 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transport device (transport mechanism) which loads and unloads (transfers) the wafers 200 into and from the process chamber 201 by moving the seal cap 219 up or down.

Figure 5:
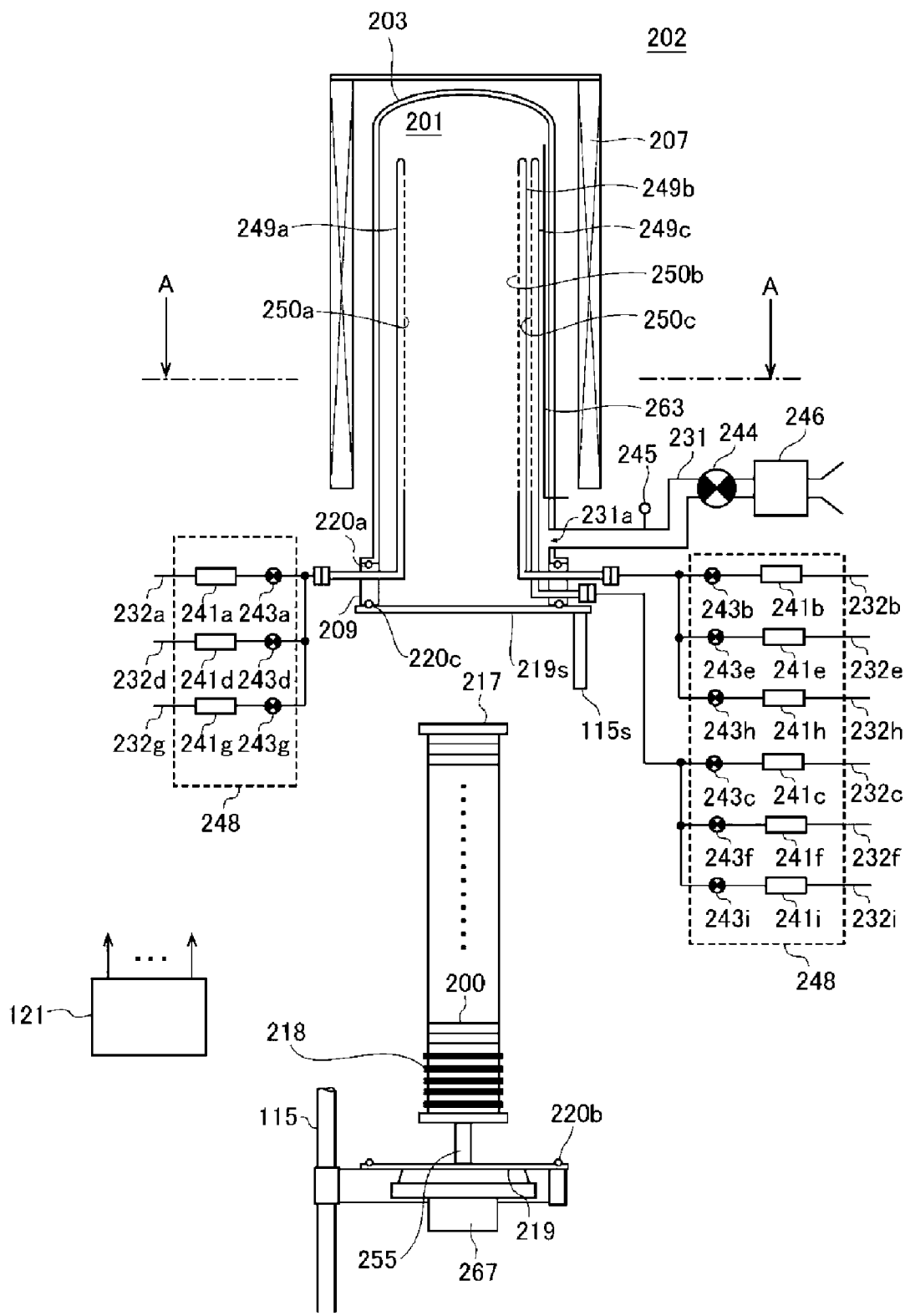
FIG. 5 is a schematic configuration diagram of a vertical process furnace of a substrate processing apparatus suitably used in embodiments of the present disclosure, in which a portion of the process furnace 202 with a support unloaded is depicted in a vertical cross-sectional view.

A shutter 219s as a furnace opening lid capable of hermetically sealing the lower end opening of the manifold 209, with the boat 217 unloaded from the interior of the process chamber 201 by moving the seal cap 219 down, is installed under the manifold 209. FIG. 5 shows a state in which the lower end opening of the manifold 209 is closed by the shutter 219s, with the seal cap 219 moved down to unload the boat 217 from the process chamber 201. The shutter 219s is made of, for example, a metal material such as SUS, and is formed in a disc shape. An O-ring 220c as a seal making contact with the lower end portion of the manifold 209 is installed on an upper surface of the shutter 219s. An opening/closing operation (an up-down movement operation, a rotational movement operation, and the like) of the shutter 219s is controlled by a shutter opening/closing mechanism 115s.

The boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. That is, the boat 217 is configured to arrange the wafers 200 in a spaced apart relationship. The boat 217 is made of, for example, a heat-resistant material such as quartz or SiC. Heat insulating plates 218 made of, for example, a heat-resistant material such as quartz or SiC, are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that the interior of the process chamber 201 has a desired temperature distribution. The temperature sensor 263 is installed along the inner wall of the reaction tube 203.

Figure 3:
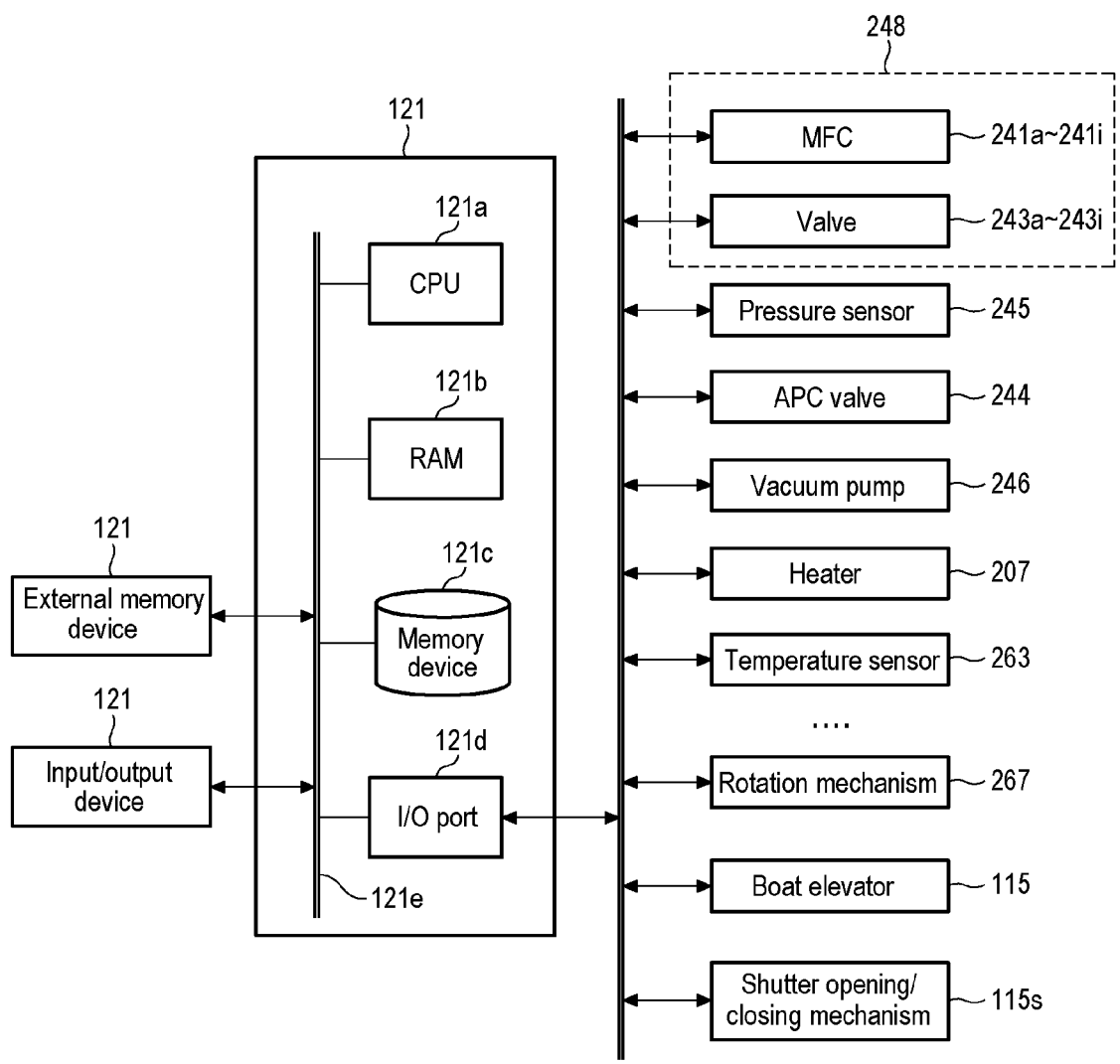
FIG. 3 is a schematic configuration diagram of a controller 121 of a substrate processing apparatus suitably used in embodiments of the present disclosure, in which a control system of the controller 121 depicted in a block diagram.

As shown in FIG. 3, the controller 121, which is a controller (control means), may be configured as a computer including a central processing unit (CPU) 121a, a random access memory (RAM) 121b, a memory device 121c, and an I/O port 121d. The RAM 121b, the memory device 121c, and the I/O port 121d are configured to be capable of exchanging data with the CPU 121a via an internal bus 121e. An input/output device 122 configured as, for example, a touch panel or the like is connected to the controller 121.

The memory device 121c includes, for example, a flash memory, a hard disk drive (HDD), a solid state drive (SSD), and the like. A control program that controls operations of a substrate processing apparatus, a process recipe in which sequences, conditions, and the like of substrate processing to be described below are described, and the like are readably stored in the memory device 121c. The process recipe functions as a program configured to be capable of causing the controller 121 to execute each sequence in the substrate processing to be described below, to obtain a predetermined result. Hereinafter, the process recipe, the control program, and the like will be generally and simply referred to as a "program." Furthermore, the process recipe will be simply referred to as a "recipe." When the term "program" is used herein, it may indicate a case of including the recipe alone, a case of including the control program alone, or a case of including both the recipe and the control program. The RAM 121b is configured as a memory area (work area) in which programs, data, and the like read by the CPU 121a are temporarily stored.

The I/O port 121d is connected to the MFCs 241a to 241i, the valves 243a to 243i, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122 or the like. Further, the CPU 121a is configured to control, according to the contents of the recipe thus read, the flow rate regulating operation of various types of gases by the MFCs 241a to 241h, the opening/closing operation of the valves 243a to 243h, the pressure regulating operation performed by the APC valve 244 based on the opening/closing operation of the APC valve 244 and the pressure sensor 245, the driving and stopping of the vacuum pump 246, the temperature regulating operation performed by the heater 207 based on the temperature sensor 263, the operation of rotating the boat 217 and adjusting the rotation speed of the boat 217 by the rotation mechanism 267, the operation of moving the boat 217 up or down with the boat elevator 115, the operation of opening and closing the shutter 219s with the shutter opening/closing mechanism 115s, and the like.

The controller 121 can be configured by installing, on the computer, the aforementioned program stored in an external memory device 123. The external memory device 123 may include, for example, a magnetic disc such as a HDD, an optical disc such as a CD, a magneto-optical disc such as a MO, and a semiconductor memory such as a USB memory or a SSD, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including the memory device 121c alone, a case of including the external memory device 123 alone, or a case of including both the memory device 121c and the external memory device 123. Further, the program may be provided to the computer by using a communication means such as the Internet or a dedicated line, instead of using the external memory device 123.

(2) Processing Process

Figure 4:
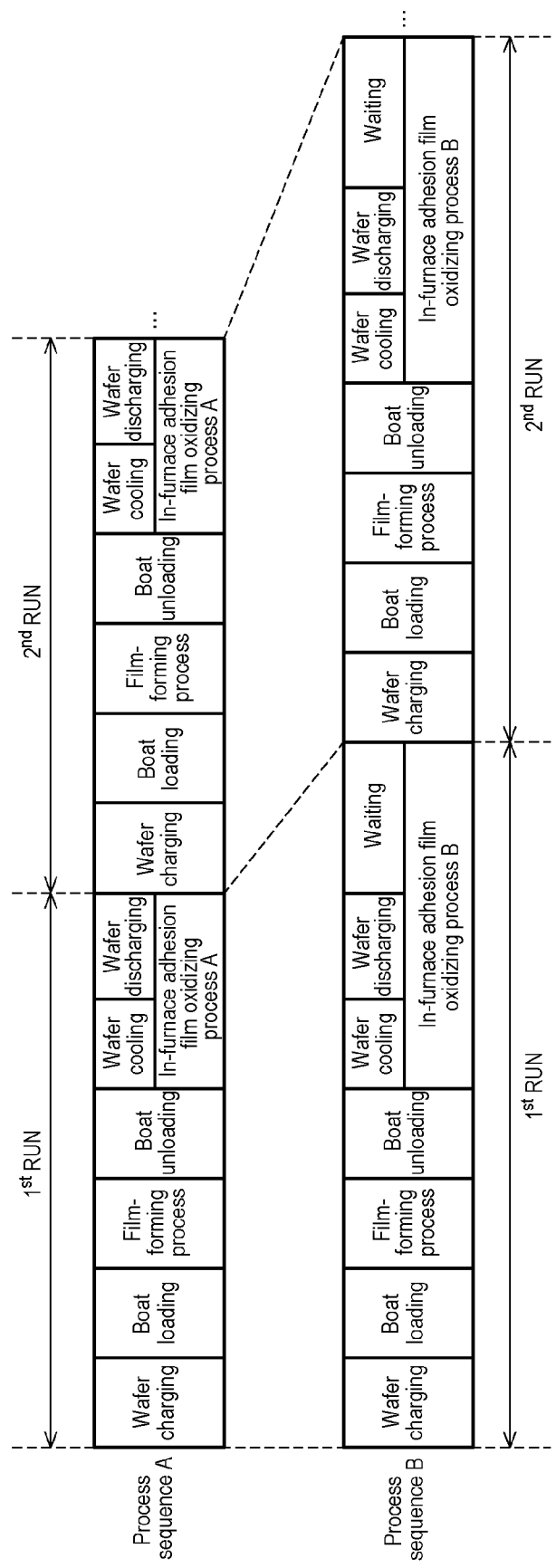
FIG. 4 is a diagram showing a comparison between a process sequence (process sequence A) in embodiments of the present disclosure and a process sequence (process sequence B) in a comparative example.

As a process of manufacturing a semiconductor device by using the substrate processing apparatus described above, a process sequence example in which a set, which includes: a step of performing a process of forming a nitride film on a wafer 200 as a substrate accommodated in a process container; and a step of oxidizing one part of the nitride film formed inside the process container after performing the process into an oxide film and maintaining another part of the nitride film formed inside the process container after performing the process as it is without oxidizing the another part of the nitride film, is performed a plurality of times will be described mainly with reference to FIG. 4. Hereinafter, operations of the respective parts constituting the substrate processing apparatus are controlled by the controller 121.

The process sequence according to the embodiments of the present disclosure includes performing a set a plurality of times, the set including:

(a) loading a wafer 200 into a process container;
(b) performing a process of forming a nitride film on the wafer 200 by supplying a film-forming gas to the wafer 200 supported by the boat 217 as a support in the process container;
(c) unloading the processed wafer 200 from an interior of the process container; and
(d) supplying an oxidizing gas into the process container from which the processed wafer 200 has been unloaded so as to oxidize one part of the nitride film formed inside the process container in (b) into an oxide film and maintain another part of the nitride film, which is different from the one part of the nitride film, as it is without oxidizing the another part.

Further, in the process sequence according to the embodiments of the present disclosure, a set in which (a), (b), (c) and (d) are performed in this order is performed a plurality of times. That is, in the process sequence according to the embodiments of the present disclosure, (d) is performed each time (a), (b), and (c) are performed. In other words, in the process sequence according to the embodiments, (d) is performed each time the process of forming the nitride film on the wafer 200 by (a), (b) and (c) is performed.

As referred to herein, the nitride film includes not only a silicon nitride film (SiN film) but also a nitride film containing carbon (C), oxygen (O), boron (B) and the like. That is, the nitride film includes a silicon nitride film (SiN film), a silicon carbonitride film (SiCN film), a silicon oxynitride film (SiON film), a silicon oxycarbonitride film (SiOCN film), a silicon borocarbonitride film (SiBCN film), a silicon boronitride film (SiBN film), a silicon borooxycarbonitride film (SiBOCN film), a silicon borooxynitride film (SiBON film), and the like. In the below-described embodiments, examples in which a SiN film is formed as a nitride film will be described.

In the below-described embodiments, description will be made on an example in which, in (b), a SiN film is formed on the wafer 200 by performing, a predetermined number of times (n times where n is an integer of 1 or more), a cycle including a step of supplying a chlorosilane-based gas to the wafer 200 and a step of supplying a N- and H-containing gas to the wafer 200.

In the embodiments of the present disclosure, such a gas supply sequence may be denoted as follows for the sake of convenience. The same notation may be used in the following description of other embodiments and modifications.

(chlorosilane-based gas→N- and H-containing gas)×n⇒SiN

Further, in the below-described embodiments, description will be made on examples in which, in (d), an O-containing gas and a H-containing gas as the oxidizing gas are simultaneously supplied into the depressurized process container from which the processed wafer 200 has been unloaded, to oxidize one part of the SiN film formed inside the process container in (b) into a SiO film and maintain another part of the SiN film different from the one part of the SiN film as it is without oxidizing the another part of the SiN film.

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

Wafer Charging

The boat 217 is charged with a plurality of wafers 200 (wafer charging). Then, the shutter 219s is moved by the shutter opening/closing mechanism 115s to open the lower end opening of the manifold 209 (shutter opening). As described above, the wafers 200 include product wafers and dummy wafers. That is, the boat 217 is charged with product wafers and dummy wafers as the wafers 200.

Boat Loading

Thereafter, as shown in FIG. 1, the boat 217 supporting the plurality of wafers 200 is lifted by the boat elevator 115 and is loaded into the process chamber 201 (boat loading). In this state, the seal cap 219 seals the lower end of the manifold 209 via the O-ring 220b.

Pressure Regulation and Temperature Regulation

After the loading of the boat is completed, the interior of the process chamber 201, that is, a space where the wafers 200 are placed, is vacuum-exhausted (decompression-exhausted) by the vacuum pump 246 to reach a desired pressure (vacuum degree). In this operation, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to have a desired processing temperature. In this operation, a state of supplying electric power to the heater 207 is feedback-controlled based on the temperature information detected by the temperature sensor 263 such that the interior of the process chamber 201 has a desired temperature distribution (temperature regulation). Further, rotation of the wafers 200 by the rotation mechanism 267 begins. The exhaust of the interior of the process chamber 201 and the heating and rotation of the wafers 200 are continuously performed at least until the processing on the wafers 200 is completed.

Film-Forming Process

Then, the following steps 1 and 2 are executed in sequence.

Step 1

In step 1, a chlorosilane-based gas is supplied to the wafers 200 in the process chamber 201.

Specifically, the valve 243a is opened to allow the chlorosilane-based gas to flow through the gas supply pipe 232a. A flow rate of the chlorosilane-based gas is regulated by the MFC 241a. The chlorosilane-based gas is supplied into the process chamber 201 via the nozzle 249a, and is exhausted from the exhaust port 231a. At this time, the chlorosilane-based gas is supplied to the wafers 200 (chlorosilane-based gas supply). In this case, the valves 243g to 243i may be opened to supply an inert gas into the process chamber 201 via the nozzles 249a to 249c, respectively.

Process conditions at this step may be exemplified as follows:

Chlorosilane-based gas supply flow rate: 0.01 to 2 slm, specifically 0.1 to 1 slm in some embodiments Inert gas supply flow rate (for each gas supply pipe): 0 to 10 slm Supply time of each gas: 1 to 120 seconds, specifically 1 to 60 seconds in some embodiments Process temperature (temperature of wafer 200): 400 to 700 degrees C., specifically 500 to 650 degrees C. in some embodiments Process pressure (internal pressure of the process chamber 201): 1 to 2666 Pa, specifically 67 to 1333 Pa in some embodiments An expression of a numerical range such as "1 to 2666 Pa" in the embodiments of the present disclosure may mean that a lower limit value and an upper limit value are included in that range. Therefore, for example, "1 to 2666 Pa" may mean "1 Pa or higher and 2666 Pa or lower." The same applies to other numerical ranges.

By supplying the chlorosilane-based gas to the wafers 200 under the aforementioned conditions, a Si-containing layer containing Cl is formed on the outermost surface of the wafer 200 as a base. The Si-containing layer containing Cl is formed by the physical adsorption or chemical adsorption of molecules of the chlorosilane-based gas to the outermost surface of the wafer 200, chemical adsorption of molecules of a substance generated by decomposition of a part of the chlorosilane-based gas, deposition of Si by thermal decomposition of the chlorosilane-based gas, or the like. The Si-containing layer containing Cl may be an adsorption layer (physical adsorption layer or chemical adsorption layer) of molecules of the chlorosilane-based gas or molecules of a substance generated by the decomposition of a part of the chlorosilane-based gas, or may be a deposition layer of Si containing Cl. In the embodiments of the present disclosure, the Si-containing layer containing Cl is also simply referred to as a Si-containing layer.

After the Si-containing layer is formed, the valve 243a is closed to stop the supply of the chlorosilane-based gas into the process chamber 201. Then, the interior of the process chamber 201 is vacuum-evacuated, and the gas or the like remaining in the process chamber 201 is removed from the interior of the process chamber 201 (purging). At this time, the valves 243g to 243i are opened to supply the inert gas into the process chamber 201. The inert gas acts as a purge gas.

As the chlorosilane-based gas, for example, a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane gas ($Si_2Cl_6$, abbreviation: HCDS) gas, an octachlorotrisilane ($Si_3Cl_8$, abbreviation: OCTS) gas, and the like may be used. Instead of the chlorosilane-based gas, a fluorosilane-based gas such as a tetrafluorosilane ($SiF_4$) gas, a bromosilane-based gas such as a tetrabromosilane ($SiBr_4$) gas, or an iodosilane-based gas such as a tetraiodosilane ($SiI_4$) gas may also be used.

As the inert gas, a rare gas such as a nitrogen ($N_2$) gas, an argon (Ar) gas, a helium (He) gas, a neon (Ne) gas, and a xenon (Xe) gas may be used. This also applies to each step as described below.

Step 2

After step 1 is completed, a N- and H-containing gas is supplied to the wafers 200 in the process chamber 201, that is, the Si-containing layer formed on each of the wafers 200.

Specifically, the valves 243b and 243c are opened to allow the N- and H-containing gas to flow through the gas supply pipes 232b and 232c, respectively. The flow rate of the N- and H-containing gas is regulated by the MFCs 241b and 241c, respectively. The N- and H-containing gas is supplied into the process chamber 201 via the nozzles 249b and 249c, respectively, and is exhausted from the exhaust port 231a. At this time, the N- and H-containing gas is supplied to the wafers 200 (N- and H-containing gas supply). In this case, the valves 243g to 243i may be opened to supply an inert gas into the process chamber 201 via the nozzles 249a to 249c, respectively. At this time, the N- and H-containing gas may be supplied from the nozzle 249b without being supplied from the nozzle 249c, or the N- and H-containing gas may be supplied from the nozzle 249c without being supplied from the nozzle 249b. That is, the N- and H-containing gas may be supplied from at least one selected from the group of the nozzles 249b and 249c.

Process conditions in this step are exemplified as follows:
N- and H-containing gas supply flow rate: 0.1 to 10 slm
N- and H-containing gas supply time: 1 to 120 seconds, specifically 1 to 60 seconds in some embodiments
Process pressure (internal pressure of the process chamber 201): 1 to 4000 Pa, specifically 1 to 3000 Pa in some embodiments
Other process conditions are the same as the process conditions in step 1.

By supplying the N- and H-containing gas to the wafer 200 under the aforementioned conditions, at least a part of the Si-containing layer formed on the wafer 200 is nitrided (modified). As a result, a silicon nitride layer (SiN layer) is formed as a layer containing Si and N on the outermost surface of the wafer 200 as the base. When forming the SiN layer, impurities such as Cl contained in the Si-containing layer constitute a gaseous substance containing at least Cl in the process of modifying the Si-containing layer by the N- and H-containing gas, and are discharged from the process chamber 201. As a result, the SiN layer becomes a layer containing fewer impurities, such as Cl, than those in the Si-containing layer formed in step 1.

After the SiN layer is formed, the valves 243b and 243c are closed to stop the supply of the N- and H-containing gas into the process chamber 201. Then, the gas and the like remaining in the process chamber 201 are removed from the process chamber 201 by the same process procedure as in the purging in step 1 (purging).

As the N- and H-containing gas, for example, a hydrogen nitride-based gas such as an ammonia ($NH_3$) gas, a diazene ($N_2H_2$) gas, a hydrazine ($N_2H_4$) gas, and a $N_3H_8$ gas may be used.

Performing a Cycle a Predetermined Number of Times

A cycle which non-simultaneously, that is, non-synchronously, performs the aforementioned steps 1 and 2 is implemented a predetermined number of times (n times where n is an integer of 1 or more), whereby a SiN film having a predetermined thickness may be formed on the surface of the wafer 200 as a base. The aforementioned cycle may be performed a plurality of times. That is, the thickness of the SiN layer formed per cycle may be set smaller than a desired film thickness and the aforementioned cycle may be performed a plurality of times until the thickness of a SiN film formed by laminating the SiN layers becomes equal to the desired film thickness, in some embodiments.

When the film-forming process is performed, deposits including the SiN film are also formed on the interior of the process container, for example, the inner wall of the process container, that is, the inner wall of the reaction tube 203, the inner wall of the manifold 209, the surfaces of the nozzles 249a to 249c, the surface of the boat 217, and the like.

After-Purge and Atmospheric Pressure Return

After the process of forming the SiN film having the desired film thickness on the wafer 200 is completed, an inert gas as a purge gas is supplied from each of the nozzles 249a to 249c into the process chamber 201 and is exhausted from the exhaust port 231a. As a result, the interior of the process chamber 201 is purged, and the gas, the reaction by-products, and the like remaining within the process chamber 201 are removed from the interior of the process chamber 201 (after-purge). Thereafter, the internal atmosphere of the process chamber 201 is substituted by the inert gas (inert gas substitution), and the internal pressure of the process chamber 201 is returned to an atmospheric pressure (atmospheric pressure return).

Boat Unloading

Thereafter, the seal cap 219 is lowered by the boat elevator 115 to open the lower end of the manifold 209. Then, the processed wafers 200 supported on the boat 17 are unloaded from the lower end of the manifold 209 to the outside of the reaction tube 203 (boat unloading). After the boat unloading, as shown in FIG. 5, the shutter 219s is moved such that the lower end opening of the manifold 209 is sealed by the shutter 219s via the O-ring 220c (shutter closing).

Wafer Cooling

After the boat unloading, that is, after the shutter closing, the processed wafers 200 are cooled to a predetermined temperature at which they can be discharged, while being supported on the boat 217 (wafer cooling).

Wafer Discharging

After the wafer cooling, the processed wafers 200 cooled to a predetermined temperature at which they may be discharged are discharged from the boat 217 (wafer discharging).

In-Furnace Adhesion Film Oxidizing Process

In parallel with the wafer cooling and the wafer discharging, the film adhering to the interior of the furnace in the film-forming process, that is, the deposit including the SiN film formed inside the process container in the film-forming process, is subjected to an oxidizing process. The oxidizing process for the SiN film formed inside the process container is performed in such a manner that the oxidizing of the SiN film is not saturated, that is, in a manner of unsaturated oxidization.

That is, after the boat is unloaded, the shutter is closed. Then, in the state of FIG. 5, in parallel with the wafer cooling and the wafer discharging, an O-containing gas and a H-containing gas as the oxidizing gas are simultaneously supplied into the process container in a depressurized state (a state below the atmospheric pressure) after the processed wafers 200 have been unloaded from the process container.

As a result, one part of the SiN film formed inside the process container in the film-forming process is oxidized into a SiO film, and another part of the SiN film different from the one part of the SiN film is maintained as it is without oxidizing the another part of the SiN film.

Specifically, after the shutter is closed, the valves 243f and 243e are opened to allow the O-containing gas and the H-containing gas to flow through the gas supply pipes 232f and 232e, respectively. The flow rates of the O-containing gas and the H-containing gas flowing through the gas supply pipes 232f and 232e are regulated by the MFCs 241f and 241e, respectively. The O-containing gas and the H-containing gas are supplied into the process chamber 201 via the nozzles 249c and 249b. The O-containing gas and the H-containing gas are mixed and reacted with each other in the process chamber 201, and then exhausted from the exhaust port 231a. At this time, water ($H_2O$)-free oxidizing species containing oxygen such as atomic oxygen generated by the reaction between the O-containing gas and the H-containing gas is supplied to the SiN film formed inside the process container (Supply of O-containing gas+H-containing gas). In this operation, the valves 243g to 243i may be opened to supply an inert gas into the process chamber 201 via the nozzles 249a to 249c.

Process conditions in this step are exemplified as follows:
O-containing gas supply flow rate: 0.1 to 10 slm
H-containing gas supply flow rate: 0.1 to 10 slm
Inert gas supply flow rate (for each gas supply pipe): 0 to 10 slm
Each gas supply time: 15 to 60 minutes
Process temperature (temperature in process chamber 201): 400 to 800 degrees C., specifically, 600 to 700 degrees C. in some embodiments
Process pressure (internal pressure of the process chamber 201): 1 to 2000 Pa, specifically, 1 to 1000 Pa in some embodiments By supplying the O-containing gas and the H-containing gas to the SiN film formed inside the process container under the aforementioned conditions, one part of the SiN film formed inside the process container may be oxidized into a SiO film with the use of strong oxidizing power of the oxidizing species such as atomic oxygen, and another part of the SiN film different from the one part of the SiN film may be maintained as it is without oxidizing the another part of the SiN film. For example, one part on the side of a surface of the SiN film formed inside the process container may be oxidized into a SiO film, and another part (a part on an opposite side of the surface) of the SiN film different from the one part of the SiN film may be maintained as it is without oxidizing the another part of the SiN film.

The one part of the SiN film formed inside the process container is expanded by taking in O when the one part is oxidized into the SiO film. Therefore, the SiO film obtained by oxidizing the one part of the SiN film formed inside the process container is thicker than the one part of the SiN film formed inside the process container before the oxidization (the part of the SiN film to be oxidized). The thickness of the SiO film obtained by oxidizing the one part of the SiN film formed inside the process container may be increased to a thickness about 1.4 to 1.5 times the thickness of the one part of the SiN film formed inside the process container before the oxidization.

In this regard, a total thickness of a laminated structure, that is, a laminated film (hereinafter, also referred to as a SiO/SiN laminated film) including the SiO film obtained by oxidizing one part of the SiN film formed inside the process container and the SiN film formed inside the process container and maintained as it is without being oxidized is greater than the thickness of the SiN film formed inside the process container before the oxidization.

Further, a stress (film stress, internal stress, or residual stress) of the SiN film formed inside the process container is a tensile stress, whereas a stress of the SiO film obtained by oxidizing one part of the SiN film formed inside the process container is a compressive stress. When the tensile stress is represented by "+" and the compressive stress is represented by "−", the stress of the SiN film formed inside the process container may be, for example, about +1.0 to 1.5 GPa, and the stress of the SiO film obtained by oxidizing one part of the SiN film formed inside the process container may be, for example, about −0.3 to 0.5 GPa.

In this regard, a total stress of the laminated film, that is, the SiO/SiN laminated film including the SiO film obtained by oxidizing one part of the SiN film formed inside the process container and the SiN film formed inside the process container and maintained as it is without being oxidized is smaller than the stress of the SiN film formed inside the process container before the oxidization. This is because the tensile stress of the SiN film and the compressive stress of the SiO film in the SiO/SiN laminated film act to cancel each other. By regulating the thickness of the SiN film or the SiO film in the SiO/SiN laminated film, it is possible to regulate a stress balance between the tensile stress of the SiN film and the compressive stress of the SiO film in the SiO/SiN laminated film and to cancel the respective stresses. That is, by regulating the stress balance, it is possible to bring the total stress of the SiO/SiN laminated film close to zero and set the stress to zero. By reducing the stress of the film formed inside the process container in this way, it is possible to suppress generation of particles due to the film formed inside the process container.

In terms of an effect of suppressing generation of particles caused by the film formed inside the process container, the total stress of the SiO/SiN laminated film may be brought close to zero in some embodiments. In such a case, it takes time to oxidize the SiN film formed inside the process container. Thus, as in a process sequence B shown in FIG. 4, an oxidizing process time, that is, an in-furnace adhesion film oxidizing process time may exceed a total time of a wafer cooling time and a wafer discharging time. In the process sequence B shown in FIG. 4, there is generated a time during which only the in-furnace adhesion film oxidizing process is performed, that is, a waiting time during which the wafer cooling and the wafer discharging are not performed. In this case, a time during which the film-forming process cannot be performed, that is, a downtime of the substrate processing apparatus becomes long, which may affect a productivity of the film-forming process.

There is also a method of converting the entire SiN film into a SiO film by oxidizing the entire SiN film formed inside the process container, that is, by saturating the oxidation of the SiN film formed inside the process container. However, in such a case, it further takes time to oxidize the SiN film formed inside the process container, and the oxidizing process time, that is, the in-furnace adhesion film oxidizing process time may significantly exceed the total time of the wafer cooling time and the wafer discharging time. In this case, the time during which the film-forming process cannot be performed, that is, the downtime of the substrate processing apparatus becomes longer, which may affect the productivity of the film-forming process. When the oxidation of the SiN film formed inside the process container is saturated to convert the entire SiN film into the SiO film, a stress of the SiO film after the conversion is a compressive stress.

On the other hand, in a case where the total stress of the SiO/SiN laminated film is not set to be zero or a compressive stress but is set to a tensile stress smaller than the stress (tensile stress) of the SiN film formed inside the process container before the oxidization, the oxidizing process time for the SiN film formed inside the process container may be shortened, and as in the process sequence A shown in FIG. 4, the oxidizing process time for the SiN film formed inside the process container, that is, the in-furnace adhesion film oxidizing process time may be made equal to or shorter than the total time of the wafer cooling time and the wafer discharging time. In such a case, the time during which the film-forming process cannot be performed does not affect the productivity of the film-forming process as in the case where the in-furnace adhesion film oxidizing process is not performed. Further, the present disclosers have found that the effect of suppressing the generation of particles can be obtained even when the total stress of the SiO/SiN laminated film is not set to zero but is set to a tensile stress smaller than the stress (tensile stress) of the SiN film formed inside the process container before the oxidization. That is, by setting the total stress of the SiO/SiN laminated film to the tensile stress smaller than the stress of the SiN film formed inside the process container before the oxidization, it is possible to maintain the productivity of the film-forming process while obtaining the effect of suppressing generation of particles. It is also possible to improve the productivity of the film-forming process by further shortening the in-furnace adhesion film oxidizing process time and accordingly shortening the total time of the wafer cooling time and the wafer discharging time.

The present disclosers have found that, by setting a ratio of the SiO film in the SiO/SiN laminated film to 75% or less, specifically 70% or less in some embodiments, that is, by setting a ratio of the SiN film in the SiO/SiN laminated film to 25% or more, specifically 30% or more in some embodiments, the total stress of the SiO/SiN laminated film may be set to a tensile stress smaller than the stress (tensile stress) of the SiN film formed inside the process container before the oxidization, whereby the same effects as those described above can be obtained. Further, the present disclosers have found that, when the ratio of the SiO film in the SiO/SiN laminated film formed in the in-furnace adhesion film oxidizing process is set to exceed 75%, the total stress of the SiO/SiN laminated film becomes a compressive stress.

Further, the present disclosers have found that, by setting the thickness of the part of the SiN film formed inside the process container and subjected to the oxidization to 65% or less, specifically 60% or less in some embodiments, of the thickness of the SiN film formed inside the process container before the oxidization, that is, by setting the thickness of the part of the SiN film formed inside the process container and maintained as it is without being oxidized to 35% or more, specifically 40% or more in some embodiments, of the thickness of the part of the SiN film formed inside the process container before the oxidization in some embodiments, the total stress of the SiO/SiN laminated film can be set to a tensile stress smaller than the stress (tensile stress) of the SiN film formed inside the process container before the oxidization, and the same effects as those described above can be obtained.

Further, the present disclosers have found that, by setting the thickness of the part of the SiN film formed inside the process container and subjected to the oxidization to become smaller than the thickness of the part of the SiN film formed inside the process container and maintained as it is without being oxidized, the total stress of the SiO/SiN laminated film may easily become a tensile stress smaller than the stress (tensile stress) of the SiN film formed inside the process container before the oxidization, and the same effects as those described above can be surely obtained.

When performing a process of changing one part of the SiN film formed inside the process container to a SiO film and maintaining another part different from the one part of the SiN film as it is, the interior of the process container, that is, the process chamber 201 may be pulse-evacuated (intermittently evacuated) in a state in which the O-containing gas and the H-containing gas are continuously supplied into the process chamber 201. That is, the opening and closing of the APC valve 244, which is an exhaust valve, may be performed a plurality of times in a state in which the O-containing gas and the H-containing gas are continuously supplied into the process chamber 201. In this operation, a step of supplying the O-containing gas and the H-containing gas into the process chamber 201 in a state in which the APC valve 244 is opened, that is, a state in which the interior of the process chamber 201 is evacuated, and a step of supplying the O-containing gas and the H-containing gas into the process chamber 201 in a state in which the APC valve 244 is closed, that is, a state in which the evacuation of the interior of the process chamber 201 is stopped, are performed a plurality of times. When the APC valve 244 is opened, the exhaust pipe 231 is opened. When the APC valve 244 is closed, the exhaust pipe 231 is closed. Even when the interior of the process chamber 201 is pulse-evacuated in a state in which the O-containing gas and the H-containing gas are continuously supplied into the process chamber 201, the interior of the process chamber 201 may be maintained in a depressurized state. In addition to continuously supplying the O-containing gas and the H-containing gas into the process chamber 201, the O-containing gas and the H-containing gas may be supplied intermittently. When the O-containing gas and the H-containing gas are intermittently supplied into the process chamber 201, at least a part of a period during which the APC valve 244 is closed, that is, a period during which evacuation of the interior of the process chamber 201 is stopped may overlap at least a part of a period during which the O-containing gas and the H-containing gas are supplied into the process chamber 201.

As shown in FIG. 2, the nozzles 249c and 249b are both arranged in the vicinity of the exhaust port 231a. The O-containing gas and the H-containing gas supplied from the nozzles 249c and 249b, respectively, may be exhausted from the exhaust port 231a before being delivered to, for example, a portion inside the process chamber 201 opposite to the exhaust port 231a. By performing the opening and closing of the APC valve 244 a plurality of times in a state in which the O-containing gas and the H-containing gas are continuously supplied into the process chamber 201, timing at which the APC valve 244 is closed may be increased, which may sufficiently deliver the O-containing gas and the H-containing gas to, for example, the portion inside the process chamber 201 opposite to the exhaust port 231a. This makes it possible to sufficiently oxidize the SiN film formed at, for example, the portion inside the process container opposite to the exhaust port 231a. That is, the SiN film formed inside the process container may be oxidized uniformly. A positional relationship between the nozzles 249c and 249b and the exhaust port 231a is not limited to that shown in FIG. 2, and the same effects may be obtained even in a case where the positional relationship is different from that shown in FIG. 2.

As the O-containing gas, it may be possible to use at least one selected from the group of an oxygen ($O_2$) gas, an ozone ($O_3$) gas, a water vapor ($H_2O$ gas), a hydrogen peroxide ($H2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas, and the like.

As the H-containing gas, it may be possible to use a hydrogen ($H_2$) gas or a deuterium ($2_{H_2}$) gas. The $2_{H_2}$ gas is also referred to as a $D_2$ gas. In this step, the supply of the H-containing gas may not be carried out, and the O-containing gas alone may be supplied as the oxidizing gas.

Further, in this step, at least one selected from the group of the O-containing gas and the H-containing gas may be plasma-excited and supplied. For example, a plasma-excited $O_2$ gas and a $H_2$ gas, which is not plasma-excited, may be supplied. An $O_2$ gas, which is not plasma-excited, and a plasma-excited $H_2$ gas may be supplied. A plasma-excited $O_2$ gas and a plasma-excited $H_2$ gas may be supplied. Further, the supply of the H-containing gas may not be carried out, and the plasma-excited $O_2$ gas alone may be supplied. As a result, it is possible to further shorten the oxidizing process time.

After completing the process of changing one part of the SiN film formed inside the process container into a SiO film and maintaining another part different from the one part of the SiN film as it is, the valves 243f and 243e are closed to stop the supply of the O-containing gas and the H-containing gas into the process chamber 201. Thereafter, an inert gas as a purge gas is supplied into the process chamber 201 from each of the nozzles 249a to 249c, and is exhausted from the exhaust port 231a. As a result, the interior of the process chamber 201 is purged, and the gas, reaction by-products, and the like remaining in the process chamber 201 are removed from the interior of the process chamber 201 (purge). Thereafter, the atmosphere in the process chamber 201 is substituted by the inert gas (inert gas substitution), and the internal pressure of the process chamber 201 is restored to an atmospheric pressure (atmospheric pressure restoration).

According to a series of the aforementioned processes, the first set (first batch process), that is, the $1^{st}$ RUN in FIG. 4, in the case where the set in which the aforementioned (a), (b), (c), and (d) are executed in this order is performed a plurality of times comes to an end. Then, this set (batch process) is performed a plurality of times. During that time, it is possible to appropriately suppress generation of particles due to the film formed inside the process container.

As described above, the in-furnace adhesion film oxidizing process is performed while the shutter is closed. That is, the in-furnace adhesion film oxidizing process is performed without loading (accommodating) the processed boat 217 and wafers 200 (product wafers and dummy wafers) into the process container. As a result, the aforementioned oxidizing process is not performed on the SiN film formed on surfaces of the processed boat 217 and wafers 200 (product wafers and dummy wafers). The SiN film formed on the surfaces of the boat 217 and wafers 200 (product wafers and dummy wafers) is maintained as it is, that is, maintained as the SiN film without being oxidized.

As a result, during at least one subsequent set (at least one subsequent batch process), that is, on or after the $2^{nd}$ RUN in FIG. 4, the film-forming process can be performed in a state in which the wafers 200, that is, the product wafers to be processed next and the dummy wafers on which the SiN film is formed, are supported by the boat 217 having the SiN film formed on its surface.

That is, during the at least one subsequent set (at least one subsequent batch process), the wafers 200 come into contact with the boat 217 via the SiN film formed on the surface of the boat 217. Specifically, the boat 217 and the product wafers to be processed next come into contact with each other via the SiN film formed on the surface of the boat 217. Further, the boat 217 and the dummy wafers come into contact with each other via the SiN film formed on each of the surfaces thereof. The SiN film formed on the surface of the boat 217 and the front surfaces (back surfaces) of the product wafers are made of materials having similar coefficients of thermal expansion. Therefore, even when the SiN film and the front surfaces (back surfaces) the product wafers are respectively heated and thermally expanded during the film-forming process, it is possible to suppress the generation of particles from contact points because the degrees of thermal expansion thereof are close to each other. Further, the SiN film formed on the surface of the boat 217 and the SiN film formed on each of the surfaces of the dummy wafers are made of the same material and have the same coefficient of thermal expansion. Therefore, even when each of the SiN films is heated and thermally expanded during the film-forming process, it is possible to suppress the generation of particles from contact points because the SiN films are thermally expanded in the same manner.

(3) Effect of the Embodiments

According to the embodiments of the present disclosure, one or more of the following effects may be obtained.

In the in-furnace adhesion film oxidizing process, one part of the SiN film formed inside the process container is oxidized into a SiO film, and another part different from the one part of the SiN film is maintained as it is without being oxidized. Therefore, the stress balance of the film formed inside the process container can be regulated, and the stress of the film formed inside the process container can be made smaller than the stress of the SiN film formed inside the process container before the oxidization. As a result, it is possible to appropriately suppress the generation of particles caused by the film formed inside the process container, prolong the cleaning cycle, and improve the productivity of the film-forming process.

In the in-furnace adhesion film oxidizing process, one part of the SiN film formed inside the process container is oxidized into a SiO film, and another part different from the one part of the SiN film is maintained as it is without being oxidized. Therefore, it is possible to shorten the oxidizing time, and maintain or improve the productivity.

In the in-furnace adhesion film oxidizing process, one part of the SiN film formed inside the process container is oxidized into a SiO film, and another part different from the one part of the SiN film is maintained as it is without being oxidized. Therefore, a cumulative film thickness in the process container can be suppressed to become thinner than that in a case where the SiO film is deposited on the surface of the SiN film formed inside the process container, and the thickness of the SiN film itself formed in the process container can be made thin. As a result, it is possible to reduce a risk of particle generation due to the increase in the cumulative film thickness in the process container and the thickness of the SiN film. In the case where the SiO film is deposited on the surface of the SiN film formed inside the process container, the thickness of the SiN film itself formed inside the process container cannot be made thin, and is maintained as it is.

In the in-furnace adhesion film oxidizing process, one part of the SiN film formed inside the process container is oxidized into a SiO film, and another part different from the one part of the SiN film is maintained as it is without being oxidized. Therefore, as compared with the case where the SiO film is deposited on the surface of the SiN film formed inside the process container, it is possible to reduce the contamination at an interface between the SiO film and the SiN film, stabilize the interface, and suppress film peeling at the interface. In the case where the SiO film is deposited on the surface of the SiN film formed inside the process container, it is considered that the interface between the SiO film and the SiN film is contaminated and the film peeling is likely to occur. It is also considered that a gas phase reaction at the time of depositing the SiO film may cause a risk of particle generation.

By regulating the thickness of the SiN film or the SiO film in the SiO/SiN laminated film which is a laminated film of the SiO film obtained by oxidizing one part of the SiN film formed inside the process container and the SiN film formed inside the process container and maintained without being oxidized, it is possible to regulate the stress balance between the tensile stress of the SiN film and the compressive stress of the SiO film in the SiO/SiN laminated film. As a result, the respective stresses can be canceled out, and the total stress of the SiO/SiN laminated film can be brought close to zero. Furthermore, the total stress may be made zero. This makes it possible to appropriately suppress the generation of particles caused by the film formed inside the process container.

By allowing the total stress of the SiO/SiN laminated film to become a tensile stress, in other words, a tensile stress which is smaller than the stress (tensile stress) of the SiN film formed inside the process container before the oxidization, it is possible to shorten the oxidizing process time, and maintain or improve the productivity of the film-forming process while achieving the effect of suppressing the generation of particles.

By setting the ratio of the SiO film in the SiO/SiN laminated film to 75% or less, specifically 70% or less in some embodiments, it is possible to allow the total stress of the SiO/SiN laminated film to become a tensile stress which is smaller than the stress (tensile stress) of the SiN film formed inside the process container before the oxidization, thereby maintaining or improving the productivity of the film-forming process while achieving the effect of suppressing the generation of particles.

By performing the in-furnace adhesion film oxidizing process without accommodating (loading) the processed boat 217 into the process container, the SiN film formed on the surface of the boat 217 can be maintained as it is without being oxidized. As a result, during the at least one subsequent set (the at least one subsequent batch process), the film-forming process can be performed while the wafers 200 to be processed next are supported by the boat 217 having the surface on which the SiN film is formed. That is, during the at least one subsequent set (the at least one subsequent batch process), the wafers 200 may contact with the boat 217 via the SiN film formed on the surface of the boat 217. This makes it possible to suppress the generation of particles from the contact points between the wafers 200 and the boat 217, as compared with the case where the SiN film formed on the surface of the boat 217 is oxidized.

When the in-furnace adhesion film oxidizing process is performed with the processed boat 217 accommodated (loaded) into the process container, at least the surface of the SiN film formed on the surface of the boat 217 is oxidized and the outermost surface of the boat is formed with a SiO film. In this case, during the at least one subsequent set (the at least one subsequent batch process), the wafers 200 make contact with the boat 217 via the SiO film formed on the outermost surface of the boat 217. In this case, the SiO film formed on the outermost surface of the boat 217 and the front surfaces (back surfaces) of the wafers 200 to be processed next are made of materials having significantly different thermal expansion coefficients from each other. As a result, when the SiO film and the front surfaces (back surfaces) of the wafers 200 are respectively heated and thermally expanded during the film-forming process, a friction at contact points thereof increases due to the difference in thermal expansion of the materials, and particles may be generated from the contact points.

By performing the in-furnace adhesion film oxidizing process without accommodating (loading) the processed boat 217 and the processed wafers 200 (product wafers and dummy wafer) into the process container, the SiN film formed on the surfaces of the boat 217 and the wafers 200 (product wafers and dummy wafers) can be maintained as it is without being oxidized. As a result, during the at least one subsequent set (the at least one subsequent batch process), the film-forming process can be performed while the product wafers to be processed next and the dummy wafers having the SiN film formed on the surface thereof are supported by the boat 217 having the SiN film formed on its surface. That is, during the at least one subsequent set (the at least one subsequent batch process), the boat 217 and the product wafers to be processed next come into contact with each other via the SiN film formed on the surface of the boat 217, and the boat 217 and the dummy wafers come into contact with each other via the SiN film formed on each of the surfaces thereof. This makes it possible to suppress the generation of particles from the contact points between the wafers 200 and the boat 217.

When the in-furnace adhesion film oxidizing process is performed with the processed boat 217 accommodated (loaded) into the process container, at least the surface of the SiN film formed on the surface of the boat 217 is oxidized and the outermost surface of the boat becomes a SiO film. In this case, during the at least one subsequent set (the at least one subsequent batch process), the wafers 200 (the product wafers to be processed next and the dummy wafers having the SiN films formed on the surfaces thereof) make contact with the boat 217 via the SiO film formed on the outermost surface of the boat 217. In this case, the SiO film formed on the outermost surface of the boat 217 and the front surfaces (back surfaces) of the wafers 200 (the product wafers to be processed next and the dummy wafers having the SiN films formed on the surfaces thereof) are made of materials having significantly different thermal expansion coefficients from each other. As a result, when the SiO film and the front surfaces (back surfaces) of the wafers 200 are respectively heated and thermally expanded during the film-forming process, the friction at the contact points thereof increases due to the difference in thermal expansion of the materials, and particles may be generated from the contact points.

Further, by performing the in-furnace adhesion film oxidizing process without accommodating (loading) the processed boat 217 into the process container, it is possible to eliminate the boat loading time and the boat unloading time for the in-furnace adhesion film oxidizing process. Accordingly, it is possible to shorten the time during which the film-forming process cannot be performed, thereby improving the productivity of the film-forming process.

By performing the in-furnace adhesion film oxidizing process in parallel with the wafer cooling, a time only for performing the in-furnace adhesion film oxidizing process separately from the wafer cooling may not be provided. This makes it possible to maintain or improve the productivity of the film-forming process. Depending on the conditions of the in-furnace adhesion film oxidizing process, the in-furnace adhesion film oxidizing process may be performed in parallel with the wafer cooling and may be completed before the wafer discharging is started.

By performing the in-furnace adhesion film oxidizing process in parallel with the wafer cooling and the wafer discharging, a time only for performing the in-furnace adhesion film oxidizing process separately from the wafer cooling and the wafer discharging may not be provided. This makes it possible to maintain or improve the productivity of the film-forming process. Depending on the conditions of the in-furnace adhesion film oxidizing process, the in-furnace adhesion film oxidizing process may be performed in parallel with the wafer cooling and the wafer discharging, and may be completed during the wafer discharging.

When the in-furnace adhesion film oxidizing process is performed, by pulse-evacuating the interior of the process container, that is, performing the opening and closing of the exhaust valve a plurality of times in a state in which the oxidizing gases, that is, the O-containing gas and the H-containing gas are continuously supplied into the process container, it is possible to sufficiently deliver the O-containing gas and the H-containing gas to, for example, the portion of the process container opposite to the exhaust port. As a result, it is possible to sufficiently oxidize the SiN film formed at, for example, the portion of the process container opposite to the exhaust port. That is, it is possible to uniformly oxidize the SiN film formed inside the process container.

The in-furnace adhesion film oxidizing process is performed every batch (every RUN), that is, each time the batch process is performed once. Therefore, as compared with a case where the in-furnace adhesion film oxidizing process is performed each time the batch process is performed a plurality of times, it is possible to oxidize a part of the SiN film while the SiN film formed inside the process container is kept thin. As a result, the oxidizing process for the SiN film formed inside the process container can be performed every time in a region where an oxidizing rate can be increased. This makes it possible to shorten the oxidizing process time. On the other hand, in the case where the in-furnace adhesion film oxidizing process is performed each time the batch process is performed a plurality of times, it is possible to oxidize a part of the SiN film while the SiN film formed inside the process container is kept thick. In this case, the oxidizing process in a region where the oxidizing rate is low may need to be performed, and the oxidizing process time may become long. In the case where the in-furnace adhesion film oxidizing process is performed every batch, it is possible to increase the ratio of the SiO film in the cumulative film formed inside the process container and further reduce the stress of the cumulative film, as compared with the case where the in-furnace adhesion film oxidizing process is performed each time the batch process is performed a plurality of times. That is, by performing the in-furnace adhesion film oxidizing process every batch, it is possible to achieve the effect of suppressing generation of particles and maintain or improve the productivity of the film-forming process while further enhancing the effect.

(4) Modifications

The process sequence according to the embodiments may be changed as in the modifications described below. These modifications may be combined arbitrarily. Unless otherwise specified, process procedures and process conditions in the respective steps of the respective modifications may be the same as the process procedure and the process conditions in the respective steps of the aforementioned process sequences.

First Modification

In step 2 of the film-forming process, the N- and H-containing gas may be plasma-excited, that is, activated into a plasma state and supplied to the wafer 200 in the process chamber 201, that is, the Si-containing layer formed on the wafer 200. That is, in the film-forming process, the respective gases may be supplied as in the gas supply sequence described below to form a SiN film on the wafer 200.

(chlorosilane gas→plasma-excited N- and H-containing gas)×n⇒SiN

Figure 6:
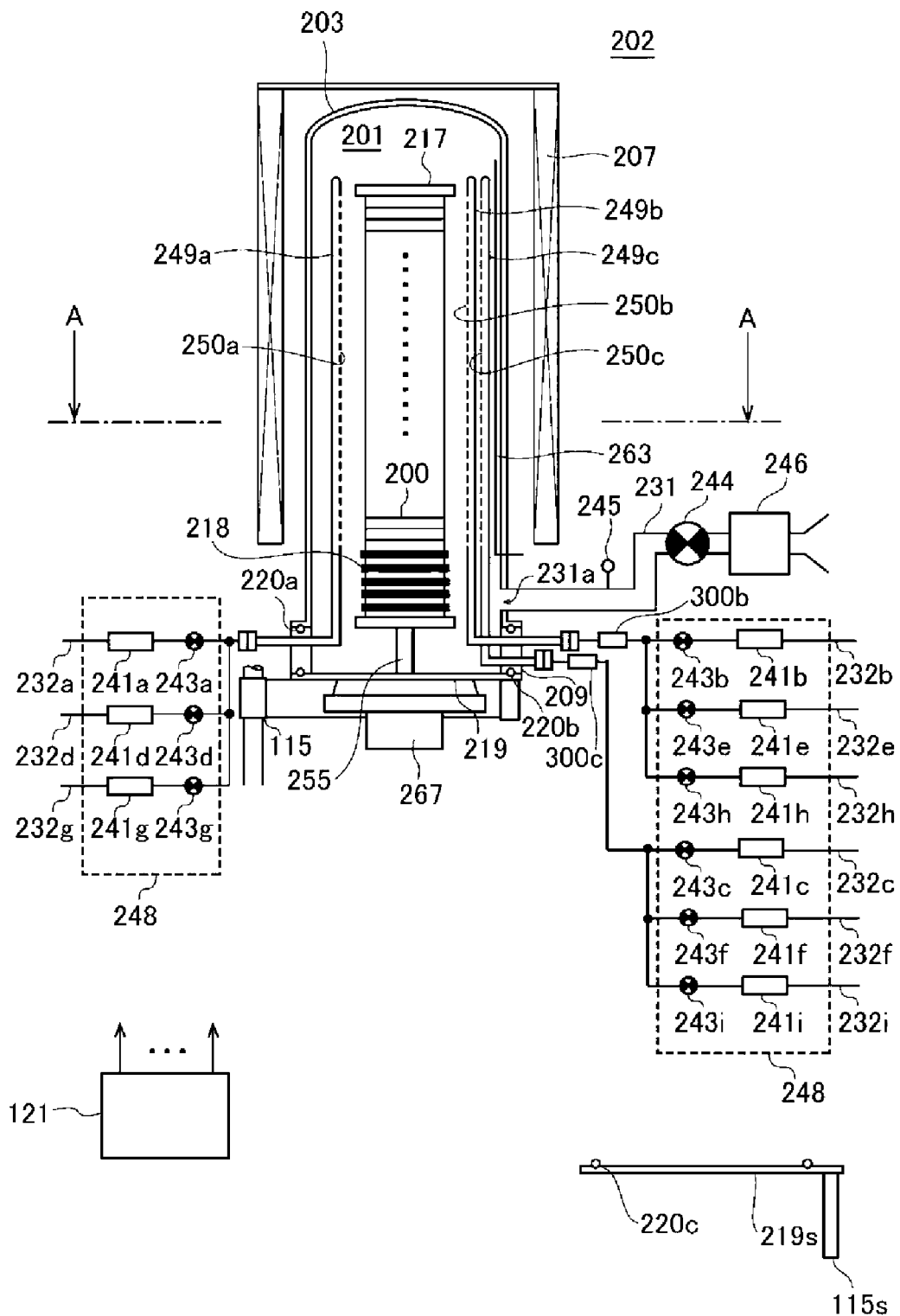
FIG. 6 is a schematic configuration diagram of a vertical process furnace of a substrate processing apparatus suitably used in a first modification of the present disclosure, in which a portion of a process furnace 202 is depicted in a vertical cross-sectional view.

In this case, in step 2 of the film-forming process, for example, as shown in FIG. 6, the N-and H-containing gases supplied into the gas supply pipes 232$b$ and 232$c$ may be plasma-excited by remote plasma units 300$b$ and 300$c$ as plasma excitation parts (plasma generation parts) respectively installed at the gas supply pipes 232$b$ and 232$c$ on the downstream side of the valves 243$b$ and 243$c$, and may be supplied into the process chamber 201. In FIG. 6, the same parts as those shown in FIG. 1 are designated by the same reference numerals, and description of configurations thereof will be omitted.

According to this modification, the same effects as those of the aforementioned embodiments may be obtained. Further, according to the modification, it is possible to further reduce the temperature of the film-forming process, as compared with the case where the film-forming process is performed in a non-plasma atmosphere, as in the aforementioned embodiments. Even when the film-forming process is performed at a lower temperature using plasma in this way, the same effects as those of the aforementioned embodiments can be obtained.

Second Modification

When performing the in-furnace adhesion film oxidizing process, at least one selected from the group of the O-containing gas and the H-containing gas may be plasma-excited, that is, activated into a plasma state, and may be supplied into the process chamber 201.

In this case, in the in-furnace adhesion film oxidizing process, for example, as shown in FIG. 6, at least one selected from the group of the H-containing gas and the O-containing gas respectively supplied into the gas supply pipes 232$b$ and 232$c$ from the gas supply pipes 232$e$ and 232$f$ may be plasma-excited by the remote plasma units 300$b$ and 300$c$ respectively installed at the gas supply pipes 232$b$ and 232$c$ on the downstream side of the valves 243$b$ and 243$c$, and may be supplied into the process chamber 201. In FIG. 6, the same parts as those shown in FIG. 1 are designated by the same reference numerals, and description of configurations thereof will be omitted.

In the in-furnace adhesion film oxidizing process, the O-containing gas may be plasma-excited without plasma-exciting the H-containing gas. Further, the H-containing gas may be plasma-excited without plasma-exciting the O-containing gas. In addition, both the O-containing gas and the H-containing gas may be plasma-excited.

According to this modification, the same effects as those of the aforementioned embodiments can be obtained. Further, according to the modification, as compared with the case where the in-furnace adhesion film oxidizing process is performed in a non-plasma atmosphere, as in the above-described embodiments, it is possible to further reduce the temperature of the in-furnace adhesion film oxidizing process. Even when the in-furnace adhesion film oxidizing process is performed at a lower temperature using plasma in this way, the same effects as those of the aforementioned embodiments can be obtained. In addition, since the temperature of the in-furnace adhesion film oxidizing process can be reduced, the process temperatures of the film-forming process and the in-furnace adhesion film oxidizing process can be made equal to each other, and the time for changing the temperature in the process container can be eliminated. This makes it possible to further improve the productivity of the film-forming process. In particular, when the H-containing gas is plasma-excited and supplied, it is possible to desorb and remove Cl contained in the SiN film adhering to the interior of the process container, and to further reduce the stress of the film adhering to the interior of the process container.

Third Modification

The in-furnace adhesion film oxidizing process may be performed not only in parallel with the wafer cooling and wafer discharging but also in parallel with the wafer charging for the wafers 200 to be processed next. That is, the in-furnace adhesion film oxidizing process may be performed in parallel with the wafer cooling, the wafer discharging, and the wafer charging for the wafers 200 to be processed next.

According to this modification, the same effects as those of the aforementioned embodiments can be obtained. Further, according to the modification, an oxidizing amount of the deposit including the SiN film formed inside the process container can be further increased, and the stress of the film formed inside the process container can be further reduced. This makes it possible to further suppress the generation of particles caused by the film formed inside the process container.

Fourth Modification

In the film-forming process, as the nitride film, a SiN film containing at least one selected from the group of C, O and B may be formed in addition to the SiN film. That is, in the film-forming process, a SiN film, a SiCN film, a SiON film, a SiOCN film, a SiBN film, a SiBCN film, a SiBOCN film, a SiBON film, or the like may be formed as the nitride film. When forming these films, in the film-forming process, at least one selected from the group of a C-containing gas, an O-containing gas, and a B-containing gas may be further supplied from the film-forming gas supply system.

Further, in the film-forming process, in addition to the silicon-based nitride film (silicon-containing nitride film or silicon nitride film), a germanium-based nitride film (germanium-containing nitride film or germanium nitride film) may be formed as the nitride film. As the germanium nitride film (GeN film), for example, GeN films containing at least one selected from the group of C, O and B may be formed in addition to the GeN film. When forming these films, in the film-forming process, a Ge-containing gas may be used instead of the Si-containing gas, and at least one selected from the group of a C-containing gas, an O-containing gas and a B-containing gas may be supplied from the film-forming gas supply system.

Further, in the film-forming process, in addition to the silicon-based nitride film (silicon-containing nitride film or silicon nitride film), a metal-based nitride film (metal-containing nitride film or metal nitride film) may be formed as the nitride film. Examples of the metal nitride film may include an aluminum nitride film (AlN film), a titanium nitride film (TiN film), a zirconium nitride film (ZrN film), a hafnium nitride film (HfN film), a tantalum nitride film (TaN film), a tungsten nitride film (WN film), a molybdenum nitride film (MoN film), and the like. When forming these films, in the film-forming process, instead of the Si-containing gas, at least one selected from the group of an Al-containing gas, a Ti-containing gas, a Zr-containing gas, a Hf-containing gas, a Ta-containing gas, a W-containing gas, and a Mo-containing gas may be supplied from the film-forming gas supply system.

As described above, in the film-forming process, a film at least containing nitrogen and at least one selected from the group of a semiconductor element and a metal element may be formed as the nitride film.

In these cases, the film-forming process may be performed in a non-plasma atmosphere by using the substrate processing apparatus shown in FIG. 1, or may be performed with plasma by using the substrate processing apparatus shown in FIG. 6.

According to the modification, the same effects as those of the aforementioned embodiments can be obtained.

Other Embodiments of the Present Disclosure

The embodiments of the present disclosure have been specifically described above. However, the present disclosure is not limited to the aforementioned embodiments, and various modifications may be made without departing from the gist thereof.

For example, a process of cleaning the interior of the process container may be performed after performing, a plurality of times, the set in which the aforementioned (a), (b), (c) and (d) are performed in this order.

That is, by performing, a plurality of times, the set in which the aforementioned (a), (b), (c) and (d) are performed in this order, a SiO/SiN laminated film is accumulated inside the process container. In this case, the interior of the process container may be cleaned before the SiO/SiN laminated film accumulated inside the process container has a thickness exceeding a critical film thickness and undergoes cracking or peeling.

When cleaning the interior of the process container, a F-containing gas as a cleaning gas is supplied from a cleaning gas supply system (F-containing gas supply system) into the process container without accommodating the wafers 200 in the process container and is exhausted from the exhaust pipe 231. At this time, the F-containing gas may be supplied into the process container in a state where the boat 217 having a SiN film formed on the surface thereof is accommodated in the process container. Further, at this time, the F-containing gas may be supplied into the process container in a state where the dummy wafer having a SiN film formed on the surface thereof is accommodated in the process container.

Process conditions in the cleaning process are exemplified as follows:
- Process temperature (internal temperature of process chamber 201): 200 to 500 degrees C.
- Process pressure (internal pressure of process chamber 201): 1330 to 26600 Pa
- $F_2$ gas supply flow rate: 0.5 to 5 slm
- $N_2$ gas supply flow rate: 1 to 20 slm By the cleaning process, a state of adhesion of the film to the interior of the process container can be reset before the effects of the aforementioned embodiments disappear. Then, the effects of the aforementioned embodiments can be continuously obtained again. According to the aforementioned embodiments, it is possible to significantly increase a cumulative thickness until the film accumulated inside the process container has a thickness exceeding a critical film thickness and undergoes cracking or peeling. This makes it possible to significantly prolong a cycle of performing the cleaning process described herein and to greatly improve a productivity of the entire film-forming process.

Recipes used in the respective processes may be provided individually according to processing contents and may be stored in the memory device 121c via a telecommunication line or the external memory device 123. Moreover, at the start of each process, the CPU 121a may properly select an appropriate recipe from the recipes stored in the memory device 121c according to the processing contents. This makes it possible to form films of various film types, composition ratios, film qualities, and film thicknesses with high reproducibility in one substrate processing apparatus. Moreover, due to these processes, the in-furnace adhesion film oxidizing process can be appropriately performed on the films of various film types, composition ratios, film qualities, and film thicknesses formed inside the process container. In addition, burden on an operator can be reduced, whereby it is possible to quickly start each process while avoiding operation errors.

The aforementioned recipes are not limited to newly-provided ones, but may be provided by, for example, changing the existing recipes already installed in the substrate processing apparatus. In the case of changing the recipes, the recipes after the change may be installed in the substrate processing apparatus via a telecommunication line or a recording medium in which the recipes are recorded. In addition, the input/output device 122 of the existing substrate processing apparatus may be operated to directly change the existing recipes already installed in the substrate processing apparatus.

In the above-described embodiments, there has been described the example in which the film is formed by using the batch type substrate processing apparatus that processes a plurality of substrates at a time. The present disclosure is not limited to the aforementioned embodiments, but may be suitably applied to, for example, a case where a film is formed by using a single-wafer type substrate processing apparatus that processes one or several substrates at a time.

Furthermore, in the aforementioned embodiments, there has been described the examples in which the film is formed by using the substrate processing apparatus including a hot wall type process furnace. The present disclosure is not limited to the aforementioned embodiments, but may also be suitably applied to a case where a film is formed by using a substrate processing apparatus including a cold wall type process furnace.

Even in the case of using these substrate processing apparatuses, each process may be performed under the same process procedures and process conditions as those in the aforementioned embodiments and modifications, and the same effects as those of the aforementioned embodiments and modifications may be obtained.

In addition, the aforementioned embodiments and modifications may be used in combination as appropriate. The process procedures and process conditions in that case may be the same as, for example, the process procedures and process conditions of the aforementioned embodiments and modifications.

According to the present disclosure in some embodiments, it is possible to prolong a cleaning cycle and improve a productivity of the film-forming process by properly suppressing generation of particles due to the film formed inside the process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    performing a set a plurality of times, the set including:
        (a) loading at least one substrate into a process container;
        (b) performing a process of forming a nitride film on the at least one substrate by supplying a film-forming gas to the at least one substrate supported by a support in the process container;
        (c) unloading the processed at least one substrate from an interior of the process container; and
        (d) supplying an oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

2. The method of claim 1, wherein (d) is performed each time (a), (b) and (c) are performed.

3. The method of claim 1, wherein in (d), a total stress of a laminated film, which includes the oxide film obtained by oxidizing the one part of the nitride film formed inside the process container and includes the another part of the nitride film formed inside the process container and maintained as it is without being oxidized, is set to a tensile stress.

4. The method of claim 1, wherein in (d), a ratio of the oxide film in a laminated film, which includes the oxide film obtained by oxidizing the one part of the nitride film formed inside the process container and includes the another part of the nitride film formed inside the process container and maintained as it is without being oxidized, is set to 75% or less.

5. The method of claim 1, wherein (d) is performed without accommodating the support in the process container.

6. The method of claim 5, wherein in (d), the nitride film formed on a surface of the support in (b) is maintained as it is without being oxidized.

7. The method of claim 6, wherein the set includes a first set and at least one subsequent set, and wherein (b) in the at least one subsequent set is performed in a state where a substrate to be processed next is supported by the support having the nitride film formed on the surface of the support in the process container.

8. The method of claim 1, wherein the at least one substrate includes a product substrate and a dummy substrate, and (d) is performed while the support, the product substrate, and the dummy substrate are not accommodated in the process container.

9. The method of claim 8, wherein in (d), the nitride film, which is formed on a surface of each of the support, the product substrate, and the dummy substrate in (b), is maintained as it is without being oxidized.

10. The method of claim 9, wherein the set includes a first set and at least one subsequent set, and
wherein (b) in the at least one subsequent set is performed in a state where the dummy substrate having the nitride film formed on its surface and the product substrate to be processed next are supported by the support having the nitride film formed on its surface in the process container.

11. The method of claim 1, wherein the set further includes: (e) cooling the processed at least one substrate unloaded from the interior of the process container, and wherein (d) is performed in parallel with (e).

12. The method of claim 1, wherein in (c), the processed at least one substrate is unloaded from the interior of the process container in a state where the processed at least one substrate is supported by the support,
wherein the set further includes:
(e) cooling the processed at least one substrate unloaded from the interior of the process container; and
(f) discharging the processed and cooled at least one substrate from the support, and
wherein (d) is performed in parallel with (e) and (f).

13. The method of claim 12, wherein the set further includes: (g) charging a substrate to be processed next into the support, and wherein (d) is performed in parallel with (e), (f), and (g).

14. The method of claim 1, wherein in (d), an exhaust valve installed at an exhaust pipe configured to evacuate the interior of the process container is repeatedly opened and closed in a state where the oxidizing gas is continuously or intermittently supplied into the process container.

15. The method of claim 1, wherein in (d), the interior of the process container is pulse-evacuated in a state where the oxidizing gas is continuously or intermittently supplied into the process container.

16. The method of claim 1, wherein (d) includes:
(d1) supplying the oxidizing gas into the process container in a state where the interior of the process container is evacuated; and
(d2) supplying the oxidizing gas into the process container in a state where the evacuation of the interior of the process container is stopped, and
wherein (d1) and (d2) are alternately performed a predetermined number of times.

17. The method of claim 1, wherein the oxidizing gas includes an oxygen-containing gas and a hydrogen-containing gas.

18. The method of claim 1, wherein the nitride film is a film at least containing nitrogen and at least one selected from the group of a semiconductor element and a metal element.

19. A substrate processing method, comprising:
performing a set a plurality of times, the set including:
(a) loading at least one substrate into a process container;
(b) performing a process of forming a nitride film on the at least one substrate by supplying a film-forming gas to the at least one substrate supported by a support in the process container;
(c) unloading the processed at least one substrate from an interior of the process container; and
(d) supplying an oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

20. A substrate processing apparatus, comprising:
a process container in which at least one substrate is processed;
a support configured to support the at least one substrate in the process container;
a film-forming gas supply system configured to supply a film-forming gas to the at least one substrate accommodated in the process container;
an oxidizing gas supply system configured to supply an oxidizing gas into the process container;
a transport device configured to transfer the at least one substrate into and out of the process container; and
a controller configured to be capable of controlling the film-forming gas supply system, the oxidizing gas supply system, and the transport device so as to perform a set a plurality of times, the set including:
(a) loading the at least one substrate into the process container;
(b) performing a process of forming a nitride film on the at least one substrate by supplying the film-forming gas to the at least one substrate supported by the support in the process container;
(c) unloading the processed at least one substrate from an interior of the process container; and
(d) supplying the oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

21. A non-transitory computer-readable recording medium storing a program that causes, by a computer, a substrate processing apparatus to perform a process comprising:
performing a set a plurality of times, the set including:
(a) loading at least one substrate into a process container of the substrate processing apparatus;
(b) performing a process of forming a nitride film on the at least one substrate by supplying a film-forming gas to the at least one substrate supported by a support in the process container;
(c) unloading the processed at least one substrate from an interior of the process container; and (d) supplying an oxidizing gas into the process container from which the processed at least one substrate has been unloaded so as to oxidize one part of the nitride film formed inside the process container in (b) into an oxide film and maintain another part of the nitride film, which is different from the one part of the nitride film, as it is without oxidizing the another part.

\* \* \* \* \*